(12) United States Patent
Chiyo et al.

(10) Patent No.: US 6,943,128 B2
(45) Date of Patent: Sep. 13, 2005

(54) METHOD FOR REDUCING SEMICONDUCTOR RESISTANCE, DEVICE FOR REDUCING SEMICONDUCTOR RESISTANCE AND SEMICONDUCTOR ELEMENT

(75) Inventors: Toshiaki Chiyo, Aichi-ken (JP); Naoki Shibata, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 103 days.

(21) Appl. No.: 10/362,513

(22) PCT Filed: Aug. 22, 2001

(86) PCT No.: PCT/JP01/07188

§ 371 (c)(1),
(2), (4) Date: Feb. 24, 2003

(87) PCT Pub. No.: WO02/17371

PCT Pub. Date: Feb. 28, 2002

(65) Prior Publication Data

US 2003/0177980 A1 Sep. 25, 2003

(30) Foreign Application Priority Data

Aug. 24, 2000 (JP) ........................................ 2000-253424
Aug. 24, 2000 (JP) ........................................ 2000-254306

(51) Int. Cl.[7] ........................ H01L 21/26; H01L 21/324; H01L 21/42; H01L 21/477
(52) U.S. Cl. ........................................ 438/795; 438/29
(58) Field of Search ..................................... 438/29, 795

(56) References Cited

U.S. PATENT DOCUMENTS 3,933,527 A * 1/1976 Tarneja et al. ................ 438/10
5,233,191 A * 8/1993 Noguchi et al. ............ 250/306
5,247,533 A 9/1993 Okazaki et al.
5,281,830 A 1/1994 Kotaki et al.
5,496,766 A 3/1996 Amano et al. ................ 438/29
5,834,326 A * 11/1998 Miyachi et al. ............... 438/29

FOREIGN PATENT DOCUMENTS

JP 59-151100 8/1984
JP 61-67914 4/1986

(Continued)

OTHER PUBLICATIONS

English translation of International Preliminary Examination Report dated Jun. 25, 2003.

*Primary Examiner*—George Fourson
*Assistant Examiner*—Fernando L. Toledo
(74) *Attorney, Agent, or Firm*—McGinn & Gibb, PLLC

(57) ABSTRACT

To lower the electrical resistance of a p-type semiconductor or the operation voltage of a light-emitting/light-receiving semiconductor device. An ion-plasma-type electron-beam irradiation apparatus 100 generates wide-area-radiation electron beams. The thus-generated electron beams are radiated to the outside through a thin metallic plate 108 formed on the outer surface of a beam extraction window 107. A p-type semiconductor is disposed below the beam extraction window 107 such that the p-type semiconductor is disposed about 20 mm away from the electron extraction window so as to be almost parallel to the metallic plate 108. When the surface of the p-type semiconductor is irradiated with electron beams by use of this apparatus, the electrical resistance of the p-type semiconductor can be effectively lowered within a short period of time; i.e., within about three minutes, which is considerably shorter than the time required in the case where a conventional electron-beam irradiation apparatus is employed. No particular limitation is imposed on the area of the beam extraction window 107, and thus wide-area-radiation electron beams are generated, and as a result, scanning with electron beams is not required to be repeated over a long period of time.

20 Claims, 9 Drawing Sheets

FOREIGN PATENT DOCUMENTS

| | | |
|---|---|---|
| JP | 3-218625 | 9/1991 |
| JP | 5-190887 | 7/1993 |
| JP | 6-350137 | 12/1994 |
| JP | 7-180053 | 7/1995 |
| JP | 8-165563 | 6/1996 |
| JP | 9-101400 | 4/1997 |
| JP | 10-135515 | 5/1998 |
| JP | 11-111965 | 4/1999 |
| JP | 2000-183465 | 6/2000 |
| JP | 2001-203168 | 7/2001 |

\* cited by examiner

FIG. 6

| | ELECTRON-BEAM IRRADIATION CONDITIONS | | | ALLOYING OF ELECTRODE |
|---|---|---|---|---|
| | METALLIC LAYER | ATMOSPHERE (PRESSURE) | TIMING OF IRRADIATION | |
| LIGHT-EMITTING DEVICE 10 | Co/Au | AIR (1 atm) | IMMEDIATELY AFTER FORMATION OF POSITIVE AND NEGATIVE ELECTRODES | ELECTRON-BEAM IRRADIATION |
| LIGHT-EMITTING DEVICE 50 | NONE | NITROGEN (1 atm) | IMMEDIATELY AFTER LAMINATION OF P-TYPE SEMICONDUCTOR LAYER | HEATING FOR THREE MINUTES AFTER FORMATION OF ELECTRODE PAD ATMOSPHERE: OXYGEN GAS (550°C, 3 Pa) |
| LIGHT-EMITTING DEVICE 70 | NONE | AIR (1 atm) | | |

METHOD FOR REDUCING SEMICONDUCTOR RESISTANCE, DEVICE FOR REDUCING SEMICONDUCTOR RESISTANCE AND SEMICONDUCTOR ELEMENT

TECHNICAL FIELD

The present invention relates to an apparatus for lowering the electrical resistance of a semiconductor, and more particularly to an apparatus for lowering the electrical resistance of a semiconductor, which includes an electron irradiation apparatus for generating and emitting excited-state electrons such that the electrons are radiated to a wide radiation area (hereinafter the electrons may be referred to as "wide-area-radiation electrons").

The present invention also relates to a method for lowering the electrical resistance of a p-type semiconductor, and to a semiconductor device including a p-type semiconductor whose electrical resistance is lowered through the method.

The present invention also relates to a Group III nitride compound semiconductor device employed in, for example, LEDs, semiconductor lasers, light-receiving devices, and electronic devices.

BACKGROUND ART

Generally known apparatuses for lowering the electrical resistance of an impurity-doped p-type semiconductor include an electron-beam irradiation apparatus described in, for example, "Present Situation and Future of GaN-Based Light-Emitting Devices" (Applied Physics, Vol. 65, No. 7, 1996).

In such a conventionally employed electron-beam irradiation apparatus, a sample (e.g., a semiconductor which is to be irradiated with electron beams) is irradiated with electron beams in a vacuum atmosphere.

DISCLOSURE OF THE INVENTION

However, as described in the above publication, the aforementioned conventional technique (conventional electron-beam irradiation apparatus) involves problems in terms of productivity; i.e., the entire surface of a sample must be scanned with electron-beam spots, and thus treatment of the surface requires a long period of time.

In the aforementioned conventional technique, a semiconductor wafer is placed in a vacuum atmosphere. Therefore, when, for example, an Mg-doped GaN p-type semiconductor is irradiated with electron beams by means of the conventional technique, nitrogen (N) atoms are removed from the surface of the semiconductor, and crystallinity of the semiconductor tends to be lowered. Thus, the conventional technique requires use of appropriately determined irradiation conditions and process control.

The present invention has been accomplished in an attempt to solve the aforementioned problems, and an object of the present invention is to provide a method and apparatus for effectively lowering the electrical resistance of a p-type semiconductor. Another object of the present invention is to effectively lower the operation voltage of a light-emitting or light-receiving semiconductor element.

In older to solve the aforementioned problems, the present invention provides the following.

That is, an invention drawn to a first feature provides an apparatus for lowering the electrical resistance of an impurity-doped semiconductor, comprising a chamber for generating excited-state electrons; a reaction chamber for irradiating an impurity-doped semiconductor with the excited-state electrons, the chambers being configured such that the pressures of the chambers can be regulated so as to differ from each other; and a pedestal or sample holder which can dispose the semiconductor a predetermined distance away from an electron extraction window of the excited-state electron generation chamber such that the semiconductor is disposed almost parallel to the electron extraction window.

An invention drawn to a second feature provides an apparatus for lowering the electrical resistance of a semiconductor as recited in connection with the first feature, wherein the predetermined distance is about some mm to about some tens of mm.

An invention drawn to a third feature provides an apparatus for lowering the electrical resistance of a semiconductor as recited in connection with the first or second feature, which further comprises a ground line for removing electrons present on the surface of the semiconductor which is discharged.

An invention drawn to a fourth feature provides an apparatus for lowering the electrical resistance of a semiconductor as recited in connection with the third feature, wherein at least a portion of the pedestal or sample holder is formed of a conductor.

An invention drawn to a fifth feature provides an apparatus for lowering the electrical resistance of a semiconductor as recited in connection with any one of the first through fourth features, wherein the pedestal or sample holder is provided in the reaction chamber, and the reaction chamber can discharge gas therefrom.

An invention drawn to a sixth feature provides an apparatus for lowering the electrical resistance of a semiconductor as recited in connection with any one of the first through fifth features, wherein the pedestal or sample holder is provided on a sample conveying line which can be moved translationally, or the pedestal or sample holder constitutes at least a portion of the sample conveying line.

An invention drawn to a seventh feature provides an apparatus for lowering the electrical resistance of a semiconductor as recited in connection with any one of the first through sixth features, wherein the pedestal or sample holder is provided on a turntable which can be rotated in one direction or in opposite directions within a certain angular range, or the pedestal or sample holder constitutes at least a portion of the turntable.

The aforementioned problems can be solved by the above-mentioned features of the present invention.

The present invention also provides the following.

An invention drawn to an eighth feature provides a method for lowering the electrical resistance of an impurity-doped semiconductor, which comprises irradiating an electron irradiation surface of an impurity-doped p-type semiconductor with excited-state electrons under atmospheric pressure or reduced pressure by use of an apparatus including a chamber for generating excited-state electrons and a chamber in which the semiconductor is placed, the chambers being provided so as to be separated from each other.

An invention drawn to a ninth feature provides a method as recited in connection with the eighth feature, wherein the p-type semiconductor is a Group III nitride compound semiconductor. Specific examples of the Group III nitride compound semiconductor include binary Group III nitride compound semiconductors (e.g., GaN, InN, and AlN), ternary Group III nitride compound semiconductors (e.g., GaInN, AlInN, and AlGaN), and quaternary Group III nitride compound semiconductors (e.g., AlGaInN), which are represented by $Al_xGa_yIn_{1-x-y}N$ (wherein $0 \leq x \leq 1$, $0 \leq y \leq 1$, and $0 \leq x+y \leq 1$).

An invention drawn to a tenth feature provides a method as recited in connection with the eighth or ninth feature, wherein the impurity is magnesium (Mg). Alternatively, the impurity may be a known p-type impurity such as zinc (Zn) or beryllium (Be).

An invention drawn to an eleventh feature provides a method as recited in connection with any one of the eighth through tenth features, wherein the pressure of an atmosphere surrounding the p-type semiconductor is approximately atmospheric pressure.

The pressure of the atmosphere surrounding the p-type semiconductor may be lower than atmospheric pressure.

An invention drawn to a twelfth feature provides a method as recited in connection with any one of the eighth through eleventh features, wherein the atmosphere surrounding the p-type semiconductor is air or a gas having an oxygen content lower than that of air.

An invention drawn to a thirteenth feature provides a method as recited in connection with any one of the eighth through twelfth features, wherein the electron irradiation surface of the p-type semiconductor is irradiated with electrons through a metallic layer formed on the surface.

An invention drawn to a fourteenth feature provides a method as recited in connection with the thirteenth feature, wherein the thickness of the metallic layer is 5 to 3,000 Å.

An invention drawn to a fifteenth feature provides a method as recited in connection with the thirteenth or fourteenth feature, wherein the metallic layer is formed of cobalt (Co), nickel (Ni), aluminum (Al), copper (Cu), palladium (Pd), manganese (Mn), vanadium (V), gold (Au), or an alloy containing at least one of these metals.

An invention drawn to a sixteenth feature provides a method as recited in connection with any one of the thirteenth through fifteenth features, wherein the atmosphere surrounding the p-type semiconductor or the metallic layer is an oxygen (O)-containing gas.

As used herein, the expression "oxygen-containing gas" refers to a gas containing at least one oxygen-containing molecule, such as $O_2$, $O_3$, Co, $CO_2$, NO, $N_2O$, $NO_2$, or $H_2O$. The oxygen-containing gas may also contain an inert gas such as a gas of a Group 0 element or nitrogen gas. Therefore, the oxygen-containing gas may be air.

An invention drawn to a seventeenth feature provides a method as recited in connection with any one of the eighth through sixteenth features, wherein a voltage for accelerating electrons which are radiated onto the electron irradiation surface is regulated to 160 KV or less.

An invention drawn to an eighteenth feature provides a method as recited in connection with any one of the eighth through seventeenth features, wherein the acceleration voltage and the electric current are maintained for at most one minute from a point in time at which the electric current of the electrons radiated onto the electron irradiation surface has reached an optimum value.

An invention drawn to a nineteenth feature provides a method for producing a p-type semiconductor of low electrical resistance as recited in connection with any one of the eighth through eighteenth features, wherein the electric potential of the p-type semiconductor or the metallic layer is maintained generally constant through, for example, grounding.

The present invention also provides the following.

An invention drawn to a twentieth feature provides a Group III nitride compound semiconductor device comprising a substrate, and a plurality of Group III nitride compound semiconductor layers which are formed through crystal growth, the semiconductor layers being provided on the substrate, which further comprises a p-type semiconductor layer in which at least a portion thereof is formed of a p-type semiconductor whose electrical resistance is lowered through a method as recited in any one of the eighth through nineteenth features.

An invention drawn to a twenty-first feature provides a Group III nitride compound semiconductor device as recited in connection with the twentieth feature, which further comprises a positive electrode formed of a metallic layer as recited in any one of the thirteenth through nineteenth features.

An invention drawn to a twenty-second feature provides a Group III nitride compound semiconductor device as recited in connection with the twentieth or twenty-first feature, wherein the positive electrode is formed on the p-type semiconductor layer, and has a multi-layer structure.

The aforementioned problems can be solved by the above-mentioned features of the present invention.

When the surface of a p-type semiconductor is irradiated with wide-area-radiation electrons by means of the aforementioned apparatus of the present invention, the electrical resistance of the p-type semiconductor can be lowered within a short period of time; i.e., within about three minutes, which is considerably shorter than the time required in the case where a conventional apparatus is employed. In the apparatus of the present invention, no particular limitation is imposed on the area of the electron extraction window or on the volume of the excited-state electron generation chamber (plasma chamber). Therefore, the region of a surface to which excited-state electrons are radiated can be readily widened, and as a result, the electrical resistance of the p-type semiconductor can be lowered within a short period of time. Therefore, when the apparatus of the present invention is employed, scanning with electron beams—which is repeated over a long period of time in the case where the conventional apparatus is employed —is not required.

The distance between the p-type semiconductor and the electron extraction window is preferably about some mm to about some tens of mm. More preferably, the distance is about 10 to about 40 mm. In the case where the distance is excessively large, particularly when the p-type semiconductor is irradiated with electrons at a pressure which approximates atmospheric pressure, energy loss is increased during the course of irradiation with electrons. In contrast, in the case where the distance is excessively small, the shapes of individual holes of the electron extraction window are directly transcribed onto the region of the p-type semiconductor (semiconductor wafer) that is irradiated with electrons, and it is difficult to attain uniform electron irradiation density.

When the apparatus of the present invention is employed, electrons with high stability are generated, and thus electron irradiation is performed under atmospheric pressure at high efficiency, as compared with the case of conventional electron-beam irradiation. Therefore, evacuation of the reaction chamber is not necessarily required before electron irradiation, and the time required for electron irradiation can be shortened. In addition, since electron irradiation can be performed under atmospheric pressure, removal of nitrogen (N) atoms from the surface of the p-type semiconductor tends not to occur, as compared with the case of conventional electron-beam irradiation performed under vacuum.

When, during the course of electron irradiation, the electric potential of the aforementioned p-type semiconductor (semiconductor wafer) is maintained generally constant by means of a ground line, charging electricity on the p-type semiconductor can be prevented or suppressed. Therefore, damage to the surface (electron irradiation surface) of the p-type semiconductor can be prevented or reduced, and the electrical resistance of the p-type semiconductor is effectively lowered.

When at least a portion of the sample holder or pedestal is formed of an electrically conductive material and is grounded, the electric potential of the p-type semiconductor (semiconductor wafer) or the metallic layer formed on the semiconductor can be maintained generally constant. Particularly when the metallic layer is formed so as to cover a relatively wide region or the entire surface of the semiconductor, and the metallic layer is directly contacted with the electrically conductive sample holder, the semiconductor is grounded more effectively. Through use of these techniques, the aforementioned grounding effects can be obtained more reliably.

When the surface of the p-type semiconductor is directly irradiated with electrons without forming the aforementioned metallic layer, preferably, the oxygen ($O_2$) content of the atmosphere surrounding the p-type semiconductor (semiconductor wafer) is low.

Specifically, when the atmosphere surrounding the p-type semiconductor is a gas having an oxygen ($O_2$) content of 1% or less, or a gas having an oxygen ($O_2$) partial pressure of $10^3$ Pa or less, oxidation of the electron irradiation surface of the p-type semiconductor can be prevented or suppressed.

As described above, when the surface of the p-type semiconductor is directly irradiated with electrons, the gas mixture ratio, partial pressure, temperature, etc. of the atmosphere surrounding the semiconductor (semiconductor wafer) are required to be regulated to predetermined values. Therefore, preferably, the reaction chamber of the apparatus of the present invention can discharge gas therefrom, and the apparatus has a port capable of introducing gas.

When a sample (p-type semiconductor or semiconductor wafer) is placed on a sample conveying line which can be moved translationally, and is moved, uniform electron irradiation density can be attained. Since such a sample conveying line enables continuous electron irradiation at high efficiency, it is particularly useful for mass-production of, for example, semiconductor devices. No particular limitation is imposed on the number of the sample conveying line provided in one apparatus for lowering the electrical resistance of a semiconductor.

When a sample (p-type semiconductor or semiconductor wafer) is placed on a turntable which can be rotated in one direction or in opposite directions within a certain angular range, and is moved, as in the case where the sample is moved by means of the aforementioned sample conveying line, uniform electron irradiation density can be attained. Such a turntable may be provided on the aforementioned sample conveying line.

The semiconductor whose electrical resistance is lowered by means of the aforementioned apparatus is suitable for use in general semiconductor devices, particularly in Group III nitride compound semiconductor devices, such as LEDs and semiconductor lasers. The semiconductor may be employed in, for example, semiconductor light-emitting devices, semiconductor light-receiving devices, and semiconductor electronic devices.

When the p-type semiconductor whose electrical resistance is sufficiently lowered is employed in a semiconductor device, for example, the operation voltage of the semiconductor device can be lowered as compared with that of a conventional semiconductor device.

FIG. 1 is a schematic cross-sectional view showing an electron irradiation apparatus 100 of the present invention. The apparatus 100 includes a grid 104, an electron extraction window 107, and a plasma chamber 105 provided between the grid 104 and the window 107. A wire 106 is provided in the plasma chamber 105. When helium ions ($He^+$)—which are generated within the plasma chamber 105 by means of a plasma power supply and the wire 106—are accelerated by means of an electric field generated by application of a high-voltage power supply of about 200 kV, the helium ions are caused to impinge at high speed on the surface of a cathode 103 provided in a vacuum chamber 101.

Thus, numerous secondary electrons are emitted from the surface of the cathode 103, and the secondary electrons are accelerated by means of the aforementioned electric field in the direction opposite the acceleration direction of the helium ions. As a result, the electron irradiation apparatus 100 produces wide-area-radiation excited-state electrons. The thus-produced electrons are radiated to the outside of the plasma chamber through a thin metallic plate 108 formed on the outer surface of the electron extraction window 107.

FIG. 2 is a schematic cross-sectional view of a p-type semiconductor which is irradiated with electrons through the method of the present invention. A p-type semiconductor formed of, for example, magnesium (Mg)-doped gallium nitride (GaN) is disposed below the electron extraction window 107 of the electron irradiation apparatus 100, such that the p-type semiconductor is disposed about 20 mm away from the electron extraction window so as to be almost parallel to the metallic plate 108.

When the surface of a p-type-impurity-doped semiconductor is irradiated with wide-area-radiation excited-state electrons through the aforementioned method, the electrical resistance of the semiconductor can be lowered within a short period of time; i.e., within about three minutes, which is considerably shorter than the time required in the case where a conventional method is employed.

No particular limitation is imposed on the area of the electron extraction window 107 (metallic plate 108) or on the volume of the plasma chamber 105. Therefore, wide-area-radiation excited-state electrons can be readily generated, and as a result, the electrical resistance of the p-type semiconductor can be lowered within a short period of time.

Therefore, when the apparatus of the present invention is employed, scanning with electron beams—which is repeated over a long period of time in the case where the conventional apparatus is employed—is not required.

When the reaction chamber (electron irradiation chamber) is separated from the plasma chamber 105, a sample is not required to be placed in a vacuum atmosphere.

When the p-type semiconductor is formed of a Group III nitride compound, the aforementioned effects are effectively obtained. Examples of the p-type impurity which may be incorporated into the p-type semiconductor include Zn, Be, and Mg. Of these, magnesium (Mg) is particularly preferred.

According to the aforementioned method for producing a p-type semiconductor of low electrical resistance, a p-type semiconductor can be placed in an atmosphere whose pressure approximates atmospheric pressure. Therefore, when the production method of the present invention is employed, removal of nitrogen atoms from the surface of the p-type semiconductor tends not to occur, as contrasted to the case of conventional electron-beam irradiation performed under vacuum, and evacuation of the reaction chamber is not required. In addition, since evacuation of the reaction chamber is prevented, or the time required for evacuation is shortened, productivity is greatly improved.

According to the method for producing a p-type semiconductor of low electrical resistance, a p-type semiconductor may be placed in, for example, air. Therefore, as compared with the case of conventional electron-beam irradiation performed under vacuum, the time required for evacuation of the reaction chamber (electron irradiation chamber) is shortened, or sealing and evacuation of the electron irradiation chamber is not required. That is, irradiation of the p-type semiconductor with electrons can be readily performed in the reaction chamber.

When the surface of a semiconductor of high electrical resistance is directly irradiated with electrons as in the case of a conventional electron irradiation method, charging electricity on the semiconductor occurs. However, as in the case of the method of the present invention, when the electron irradiation surface of a semiconductor is irradiated with electrons through a metallic layer formed on the surface, such charging does not occur, and the surface of the semiconductor can be uniformly irradiated with electrons.

When a metallic layer having a thickness of 5 to 3,000 Å is formed on a p-type semiconductor, the electrical resistance of the p-type semiconductor can be effectively lowered. The thickness of the metallic layer is preferably about 100 Å. When the thickness of the metallic layer is excessively small, the aforementioned effects are not fully obtained.

In contrast, when the thickness of the metallic layer is excessively large, irradiation of the p-type semiconductor with electrons is not performed efficiently, and the effect of irradiating the semiconductor with electrons is unsatisfactory.

In the case where the metallic layer provided on the semiconductor is formed of two or more metals having different electronegativities, and the metal which is in contact with the semiconductor has a higher electronegativity and is easily oxidized, when the semiconductor is irradiated with electrons through the method of the present invention in an atmosphere containing oxygen (O), the metal which is in contact with the semiconductor is reacted with oxygen (O), and the metal penetrates through the metallic layer and is exposed on the surface of the layer. In this case, impurities present at the interface between the metallic layer and the semiconductor are removed. Thus, a layer of a metal which has not been in direct contact with the semiconductor comes into direct contact with the semiconductor.

When the metallic layer has a thickness of more than 300 Å, difficulty is encountered in supplying $O_2$ to the interface between the metallic layer and the p-type semiconductor. Therefore, when the semiconductor is irradiated with electrons in an oxygen (O)-containing atmosphere through the method of the present invention, preferably, the thickness of the metallic layer is regulated to about 100 Å.

The metallic layer may be formed of an oxidative metal. Even in such a case, effects comparable to or better than those described above are obtained.

The metallic layer is preferably formed of, for example, cobalt (Co), nickel (Ni), aluminum (Al), copper (Cu), palladium (Pd), manganese (Mn), vanadium (V), gold (Au), or an alloy containing at least one of these metals. When the metallic layer is formed of such a metal, the electrical resistance of the semiconductor can be lowered to an acceptable or predetermined level.

When, during the course of electron irradiation, the electric potential of the aforementioned p-type semiconductor or metallic layer is maintained generally constant through, for example, grounding, electrification of the p-type semiconductor can be prevented or suppressed. Therefore, damage to the surface (electron irradiation surface) of the p-type semiconductor can be prevented or reduced, and the electrical resistance of the p-type semiconductor is effectively lowered.

For example, when a sample holder as shown in FIG. 2 is formed of an electrically conductive material, and the sample holder is grounded, the electric potential of the p-type semiconductor or the metallic layer formed thereon can be maintained generally constant. Particularly when the metallic layer is formed so as to cover a relatively wide region or the entire surface of the semiconductor, and the metallic layer is brought into direct contact with the electrically conductive sample holder, the semiconductor is grounded more effectively. Therefore, the aforementioned effects can be obtained more reliably.

The p-type semiconductor whose electrical resistance is lowered by means of the aforementioned method is suitable for use in general semiconductor elements, particularly in Group III nitride compound semiconductor elements, such as light-emitting devices and light-receiving devices (e.g., LEDs and semiconductor lasers). The semiconductor is also suitable for use in, for example, Group III nitride compound semiconductor devices such as electronic devices.

When the p-type semiconductor whose electrical resistance is sufficiently lowered is employed in a semiconductor device, for example, the operation voltage of the semiconductor device can be reduced as compared with that of a conventional semiconductor device.

The aforementioned metallic layer formed on the electron irradiation surface of the p-type semiconductor can be employed as, for example, a positive electrode of a Group III nitride compound semiconductor device. In this case, another metallic layer serving as a positive electrode is not necessarily formed, and thus costs (e.g., material cost) required for forming the metallic layer can be reduced.

When the metallic layer which has been formed on the surface of the p-type semiconductor before electron irradiation has a multi-layer structure, a positive electrode of a semiconductor device including the p-type semiconductor whose electrical resistance is lowered through the aforementioned method has a multi-layer structure. When the metallic layer of multi-layer structure is irradiated with electrons, alloying of the metallic layer can be effected. Therefore, the positive electrode of the semiconductor tends not to undergo oxidation, contact resistance between the positive electrode and the p-type semiconductor is lowered, deterioration of the positive electrode with passage of time is reduced, and the positive electrode exhibits excellent light transmittance and adhesion.

When the positive electrode is formed of the metallic layer, unlike the case of a conventional production process, alloying of the positive electrode is not required, and thus productivity is improved.

After the metallic layer is irradiated with electrons through the method of the present invention, the entirety of the metallic layer may be removed, followed by formation of a metallic layer (i.e., a positive electrode of a semiconductor device) on the p-type semiconductor. Therefore, the metallic layer which has been formed on the surface of the p-type semiconductor before electron irradiation does not necessarily satisfy requirements for a positive electrode of a semiconductor element.

When a positive electrode of a semiconductor device is formed of an alloy, alloying conditions for the positive electrode can be determined (optimized) separately from other processes of the method of the present invention, in accordance with the type of a metal employed for forming the positive electrode and the thickness of the electrode. Therefore, the operation voltage of the semiconductor device can be reliably reduced.

BRIEF DESCRIPTION OF THE DRAWINGS

FIG. 6 shows a table describing electron irradiation conditions for p-type semiconductors of light-emitting devices 10, 50, and 70.

BEST MODE FOR CARRYING OUT THE INVENTION

Best modes of the present invention described in the section "Disclosure of the Invention" will next be described. Preferred modes of the present invention are also described in the section "Disclosure of the Invention." Therefore, the scope of the appended claims should be interpreted on the basis of the entire description of the present specification, including the section "Disclosure of the Invention" and the present section.

The present invention will next be described with reference to specific embodiments, which should not be construed as limiting the invention thereto.

(First Embodiment)

Figure 1:
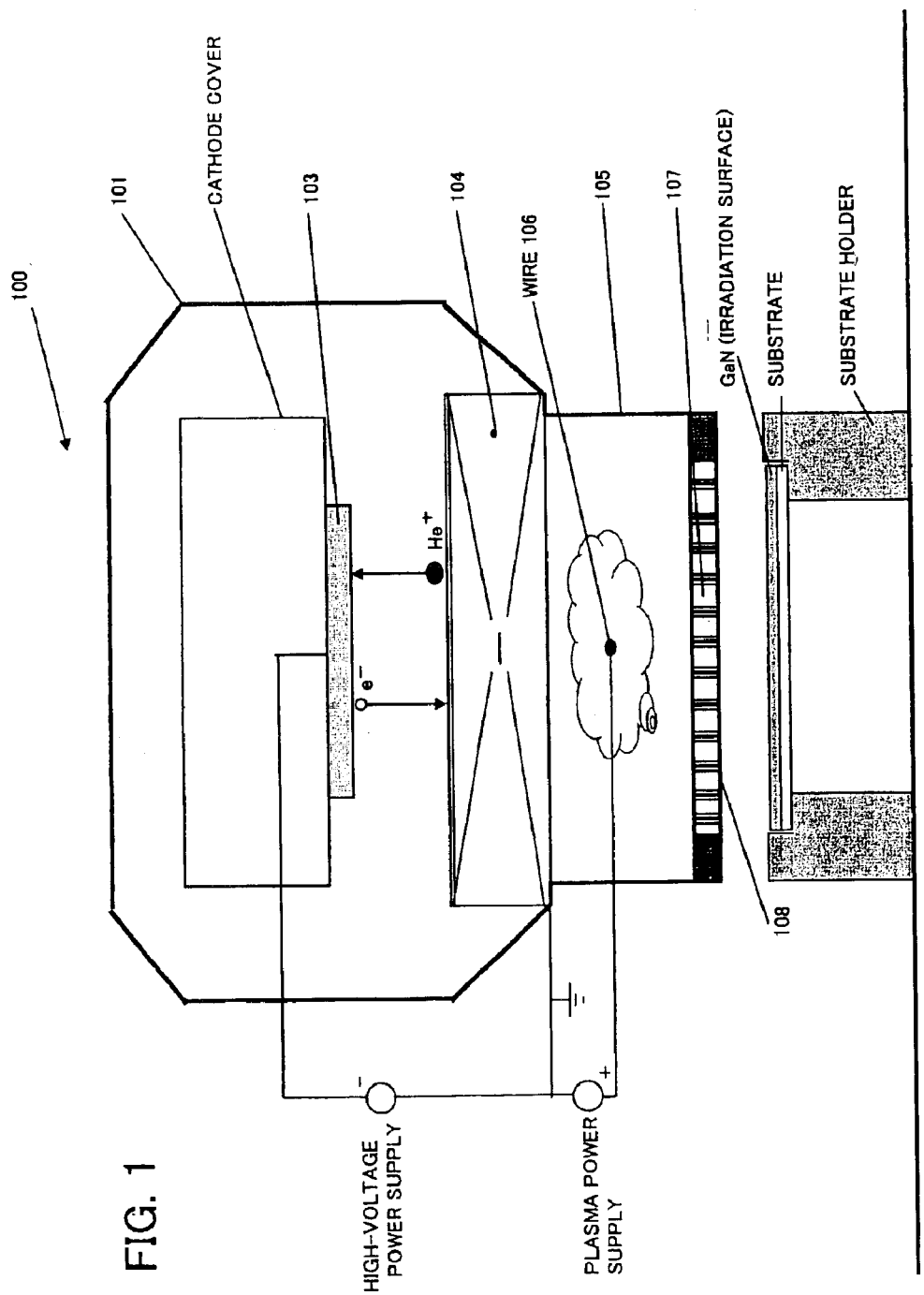
FIG. 1 is a schematic cross-sectional view showing an ion-plasma-type electron irradiation apparatus 100 of the present invention.

FIG. 1 is a schematic cross-sectional view showing an ion-plasma-type electron irradiation apparatus 100 of the present invention. The apparatus 100 includes a grid 104, an electron extraction window 107, and a plasma chamber 105 provided between the grid 104 and the window 107. A wire 106 is provided in the plasma chamber 105. When helium ions (He$^+$)—which are generated within the plasma chamber 105 by means of a plasma power supply of about 300 v and the wire 106—are accelerated by means of an electric field generated by use of a high-voltage power supply of about 200 kV, the helium ions are impinged at high speed on the surface of a cathode 103 provided in a vacuum chamber 101.

Thus, numerous secondary electrons are emitted from the surface of the cathode 103, and by means of the aforementioned electric field the secondary electrons are accelerated in the direction opposite the acceleration direction of the helium ions. As a result, the ion-plasma-type electron irradiation apparatus 100 produces wide-area-radiation excited-state electrons. The thus-produced electrons are radiated to the outside of the plasma chamber through a thin metallic plate 108 formed on the outer surface of the electron extraction window 107.

Figure 2:
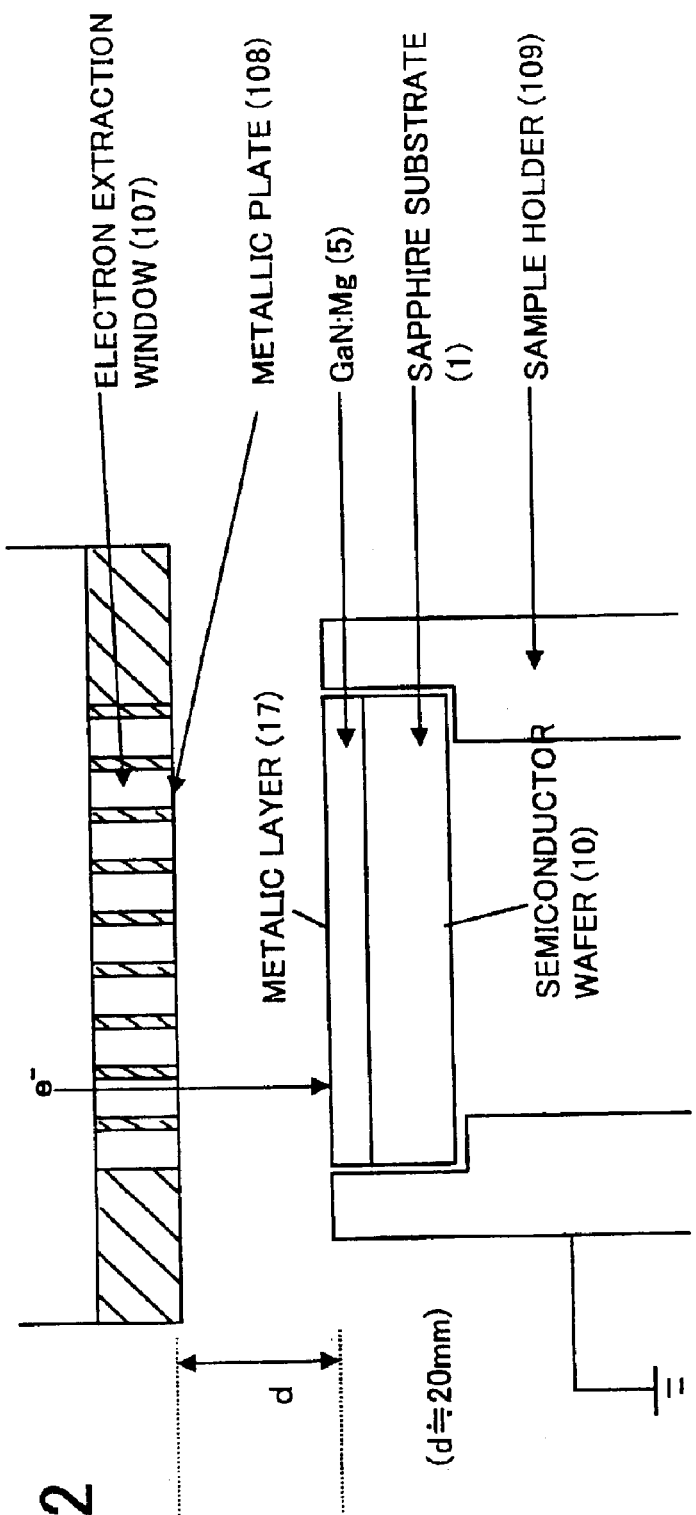
FIG. 2 is a schematic cross-sectional view of a p-type semiconductor (GaN:Mg) which is irradiated with electrons through the method of the present invention.

FIG. 2 is a schematic cross-sectional view of a p-type semiconductor which is irradiated with electrons through the method of the present invention. A p-type semiconductor formed of, for example, magnesium (Mg)-doped gallium nitride (GaN) is placed on a metallic sample holder 109, and disposed below the electron extraction window 107 of the ion-plasma-type electron irradiation apparatus 100 such that the p-type semiconductor is disposed about 20 mm away from the electron extraction window so as to be almost parallel to the metallic plate 108.

When the sample holder 109 is formed of an electrically conductive material and is grounded, the electric potential of the p-type semiconductor or a metallic layer formed thereon can be maintained generally constant. Particularly, the semiconductor is grounded more effectively when the metallic layer is formed so as to cover a relatively wide region or the entire surface of the semiconductor and the metallic layer is directly contacted with the electrically conductive sample holder. Therefore, the aforementioned effects can be obtained more reliably.

In the apparatus 100 for lowering the electrical resistance of a semiconductor, no particular limitation is imposed on the area of the electron extraction window 107 (metallic plate 108) or on the volume of the plasma chamber 105, and thus wide-area-radiation electrons can be readily generated. Therefore, when the apparatus is employed, scanning with electron beams—which is repeated over a long period of time in the case where the conventional apparatus is employed—is not required.

When the surface of a p-type semiconductor is irradiated with wide-area-radiation excited-state electrons by use of this apparatus, the electrical resistance of the p-type semiconductor can be lowered within a short period of time; i.e., within about three minutes, which is considerably shorter than the time required in the case where a conventional apparatus is employed.

When the p-type semiconductor is formed of a Group III nitride compound, the aforementioned effects are effectively obtained. Preferred examples of the p-type impurity which may be incorporated into the p-type semiconductor include magnesium (Mg).

(Evaluation of Reduction of Electrical Resistance by Use of a Sample for Measurement of Hole Concentration)

In order to evaluate reduction of the electrical resistance of a p-type semiconductor irradiated with electrons by use of the aforementioned apparatus 100, the below-described sample for measurement of hole concentration was employed.

As shown in FIG. 2, an AlN buffer layer 2 (thickness: about 25 nm) is formed on a sapphire substrate 1 of a sample (semiconductor wafer 10), and a magnesium-doped gallium nitride (GaN:Mg) p-type semiconductor layer 5 is formed on the buffer layer.

A Co/Au metallic layer 17 (thickness: about 100 Å) is formed on the surface (electron irradiation surface) of the p-type semiconductor layer 5.

The sample (semiconductor wafer 10) was irradiated with electrons through the metallic layer 17 in air by use of the aforementioned ion-plasma-type electron irradiation apparatus 100 (FIG. 2).

In this case, the acceleration voltage supplied from the charged particle acceleration mechanism (high-voltage power supply shown in FIG. 1) was regulated to about 160 to about 200 kv, and the sample was irradiated with electrons for about three minutes.

Figure 3:
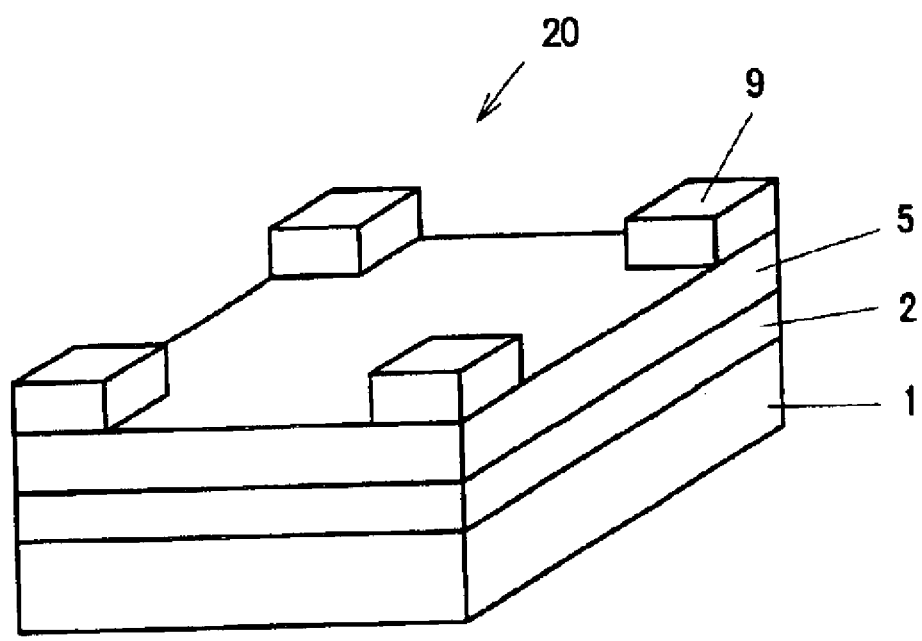
FIG. 3 is a schematic perspective view showing the structure of a sample 20 employed for measuring the hole concentration of a p-type semiconductor (GaN:Mg) according to a specific embodiment of the present invention.

FIG. 3 is a schematic perspective view showing the structure of a sample 20 employed for measuring the hole concentration of the p-type semiconductor (GaN:Mg). After the aforementioned sample (semiconductor wafer 10) was irradiated with electrons, the resultant sample was treated with aqua regia, to thereby remove the Co/Au metallic layer 17. Thereafter, as shown in FIG. 3, nickel (Ni) measurement pads 9 (each having a thickness of about 3,000 Å) were formed on four corners of the above-treated sample through deposition, to thereby produce the sample 20.

Figure 4:
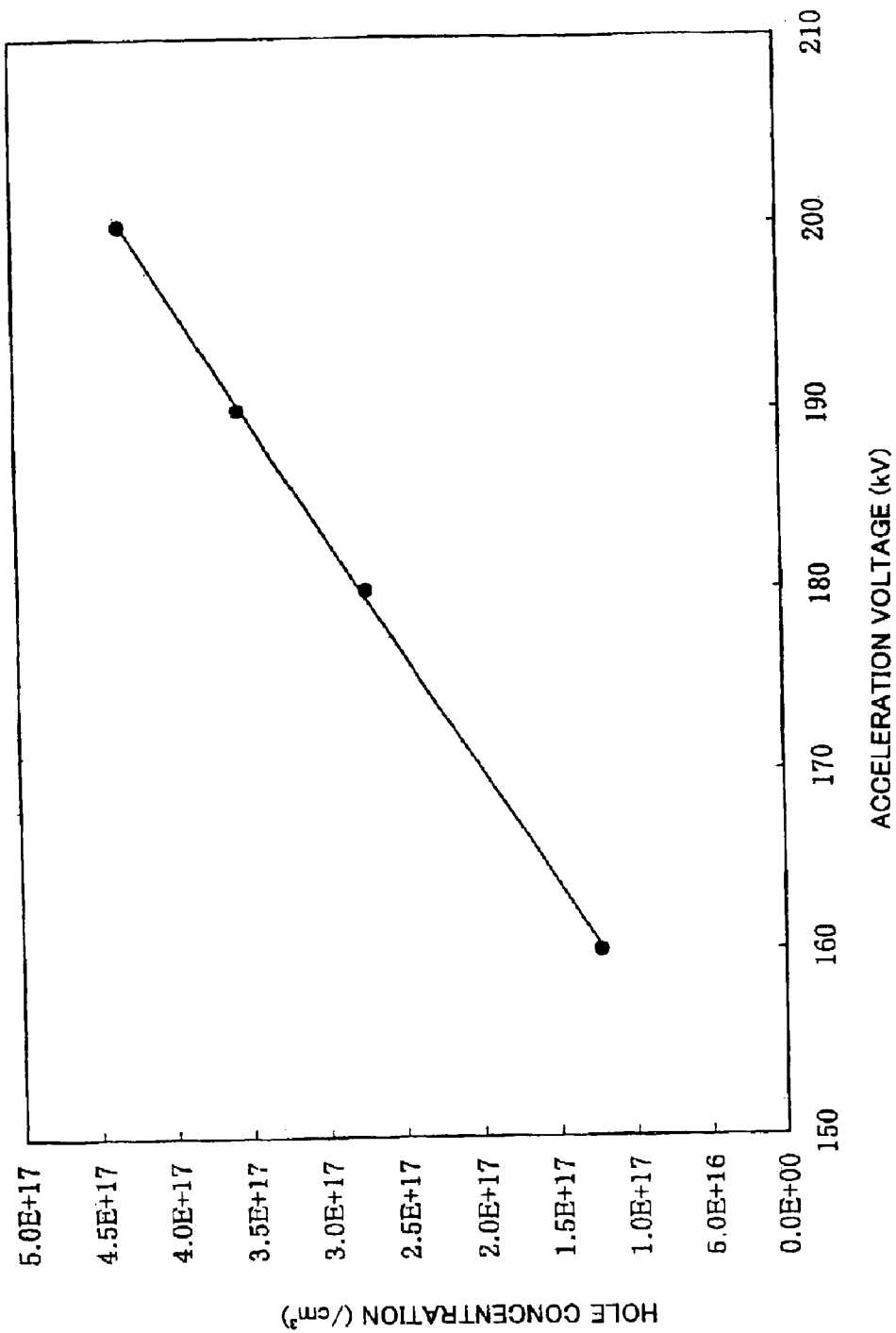
FIG. 4 is a graph showing the results of measurement of the hole concentrations of four samples 20, the hole concentrations being measured while acceleration voltage is varied.

FIG. 4 is a graph showing the results of measurement of the hole concentrations of four samples 20. The hole concentrations of the p-type semiconductor layers 5 of the samples 20 were measured while acceleration voltage was varied.

The measurement results show that the above-produced sample exhibits a hole concentration of about $10^{17}/cm^3$ to about $10^{18}/cm^3$, which is equal to or higher than that of a conventional semiconductor wafer.

The p-type semiconductor whose electrical resistance is lowered by means of the aforementioned method is suitable for use in, for example, general semiconductor elements, light-emitting elements such as LEDs and semiconductor lasers, light-receiving elements, and Group III nitride compound semiconductor elements such as electronic devices.

When the p-type semiconductor whose electrical resistance is sufficiently lowered is employed in a semiconductor element, for example, the operation voltage of the semiconductor element can be lowered as compared with that of a conventional semiconductor element.

(Second Embodiment)

In a second embodiment, the method for lowering the electrical resistance of a semiconductor, particularly a p-type Group III nitride semiconductor, will be described.

FIG. 3 is a schematic perspective view showing the structure of the sample 20 employed for measuring the hole concentration of the p-type semiconductor (GaN:Mg) according to the second embodiment. The AlN buffer layer 2 (thickness: about 25 nm) is formed on the sapphire substrate 1, and the magnesium-doped gallium nitride (GaN:Mg) p-type semiconductor layer 5 is formed on the buffer layer 2.

The Co/Au metallic layer 17 (thickness: about 100 Å) is formed on the surface of the p-type semiconductor layer 5. The semiconductor layer 5 was irradiated with electrons through the metallic layer 17 in air by use of the aforementioned electron irradiation apparatus 100. In this case, the acceleration voltage supplied from the high-voltage power supply (see FIG. 1) was regulated to about 100 to about 250 kV, and the sample was irradiated with electrons for about three minutes.

Subsequently, the resultant sample was treated with an iodine-containing etchant, to thereby remove the Co/Au metallic layer. Thereafter, as shown in FIG. 3, the nickel (Ni) measurement pads 9 (each having a thickness of about 3,000 Å) were formed on four corners of the above-treated sample through deposition, to thereby produce the sample 20.

The hole concentrations of the p-type semiconductor layers 5 of a number of samples 20 were measured. The measurement results show that the p-type semiconductor 5 exhibits a hole concentration as high as about $10^{17}/cm^3$ to about $10^{18}/cm^3$.

Figure 5:
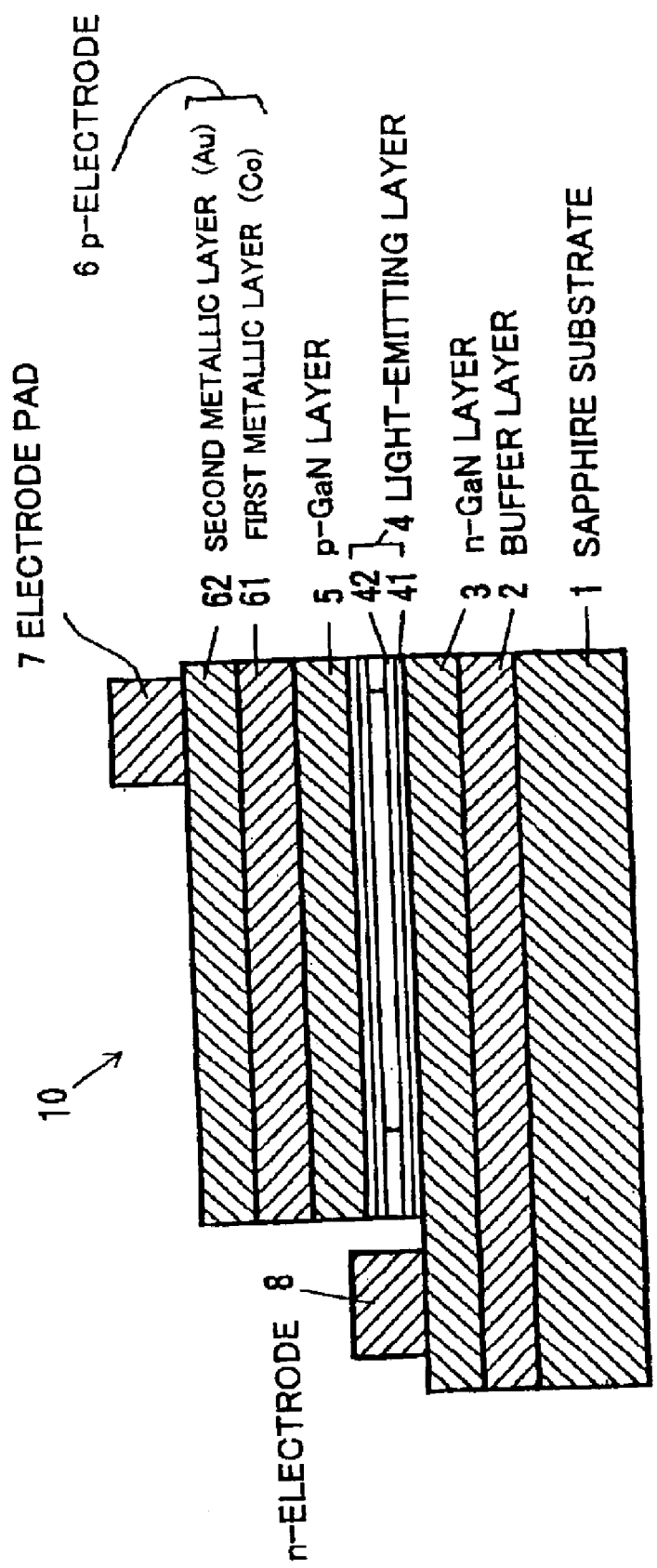
FIG. 5 is a schematic cross-sectional view showing the structure of a Group III nitride compound semiconductor device 10 according to a specific embodiment of the present invention.

(Third Embodiment) FIG. 5 is a schematic cross-sectional view showing the structure of a Group III nitride compound semiconductor element 10 according to a third embodiment of the present invention. As shown in FIG. 5, an AlN buffer layer 2 (thickness: about 25 nm) is formed on a sapphire substrate 1, and an Si-doped n-type GaN layer 3 (thickness: about 4 µm) is formed on the buffer layer 2. A light-emitting layer 4 is formed on the n-type GaN layer 3. The light-emitting layer 4 has a multi-quantum well (MQW) structure including six $Ga_{0.8}In_{0.2}N$ well layers 41 (each having a thickness of about 35 Å) and five GaN barrier layers 42 (each having a thickness of about 35 Å), the well layers and barrier layers being laminated alternately. A p-type GaN layer 5 (thickness: about 250 nm) is formed on the light-emitting layer 4.

A first metallic layer 61 containing Co (thickness: about 15 Å) and a second metallic layer 62 containing Au (thickness: about 60 Å) are successively formed on the p-type GaN layer 5. The first and second metallic layers 61 and 62 are formed by metal deposition. A light-transmittable p-electrode 6 includes the first and second metallic layers 61 and 62. A cobalt (Co) electrode pad 7 (thickness: about 1.5 µm) is formed on a predetermined region of the p-electrode 6. A negative electrode 8 is formed on the n-type GaN layer 3. The negative electrode 8 includes a vanadium (V) layer (thickness: about 200 Å), and a layer (thickness: about 1.8 µm) formed of aluminum (Al) or an Al alloy.

The production method for the light-emitting element 10 will next be described.

The light-emitting element 10 was produced through metal-organic vapor phase epitaxy (hereinafter called "MOVPE"). The following gasses were employed: ammonia ($NH_3$), carrier gas ($H_2$ or $N_2$), trimethylgallium (Ga($CH_3$)$_3$, hereinafter called "TMG"), trimethylaluminum (Al($CH_3$)$_3$, hereinafter called "TMA"), trimethylindium (In($CH_3$)$_3$, hereinafter called "TMI"), silane ($SiH_4$), and cyclopentadienylmagnesium (Mg($C_5H_5$)$_2$, hereinafter called "$CP_2Mg$").

Firstly, a monocrystalline sapphire substrate 1 containing an a-plane as a primary crystal plane was cleaned through organic cleaning and heat treatment, and the substrate 1 was mounted on a susceptor provided in a reaction chamber of an MOVPE apparatus. Subsequently, the sapphire substrate 1 was baked at 1,100° C. while $H_2$ was caused to flow (flow rate: 2 liters/minute) through the reaction chamber at ambient pressure for about 30 minutes.

Subsequently, the temperature of the substrate 1 was lowered to 400° C., and $H_2$ (20 liters/minute), $NH_3$ (10 liters/minute), and TMA ($1.8 \times 10^{-5}$ mol/minute) were fed, to thereby form an AlN buffer layer 2 (thickness: about 25 nm) on the substrate 1.

Subsequently, while the temperature of the sapphire substrate 1 was maintained at 1,150° C., $N_2$ or $H_2$ (10 liters/minute), $NH_3$ (10 liters/minute), TMG ($1.12 \times 10^{-4}$ mol/minute), TMA ($0.47 \times 10^{-4}$ mol/minute), and silane diluted with $H_2$ gas to 0.86 ppm ($5 \times 10^{-9}$ mol/minute) were fed, to thereby form an n-type GaN layer 3 (thickness: about 4 µm, electron concentration: $1 \times 10^{18}/cm^3$, silicon concentration: $2 \times 10^{18}/cm^3$).

After the n-type GaN layer 3 was formed, $N_2$ or $H_2$ (20 liters/minute), $NH_3$ (10 liters/minute), TMG ($7.2 \times 10^{-5}$ mol/minute), and TMI ($0.19 \times 10^{-4}$ mol/minute) were fed, to thereby form a $Ga_{0.8}In_{0.2}N$ well layer 41 (thickness: about 35 Å). Subsequently, $N_2$ or $H_2$ (20 liters/minute), $NH_3$ (10 liters/minute), and TMG ($2.0 \times 10^{-4}$ mol/minute) were fed, to thereby form a GaN barrier layer 42 (thickness: about 35 Å). Formation of the well layer 41 and formation of the barrier layer 42 were performed five times each under the aforementioned conditions, and a GaInN barrier layer was formed on the outermost barrier layer 42. Thus, a light-emitting layer 4 having an MQW structure was formed.

Subsequently, while the temperature of the sapphire substrate 1 was maintained at 1,100° C., $N_2$ or $H_2$ (20 liters/minute), $NH_3$ (10 liters/minute), TMG ($1.12 \times 10^{-4}$ mol/minute), and $Cp_2Mg$ ($2 \times 10^{-5}$ mol/minute) were fed, to thereby form an Mg-doped p-type GaN layer 5 (thickness: about 250 nm, Mg concentration: $5 \times 10^{19}/cm^3$).

Subsequently, the surface of the n-type GaN layer 3 was exposed. Specifically, an etching mask was formed on the p-type GaN layer 5, and a predetermined region of the mask was removed. Thereafter, in a region which was not covered with the mask, the p-type GaN layer 5, the light-emitting layer 4, and a portion of the n-type GaN layer 3 were subjected to reactive ion etching by use of a gas containing chlorine, to thereby expose the surface of the n-type GaN layer 3.

Subsequently, through the below-described procedure, a negative electrode 8 was formed on the n-type GaN layer 3, and a light-transmittable p-electrode 6 was formed on the p-type GaN layer 5.

(1) A photoresist was applied onto the exposed surface of the n-type GaN layer 3, a window was formed at a predetermined region on the exposed surface through photolithography, and the deposition apparatus was evacuated to $10^{-3}$ Pa or less. Thereafter, a vanadium (V) layer (thickness: about 200 Å) and an Al layer (thickness: about 1.8 $\mu$m) were formed through deposition. Subsequently, the photoresist was removed, to thereby form the negative electrode 8 on the exposed surface of the n-type GaN layer 3.

(2) Subsequently, a photoresist was uniformly applied onto the p-type GaN layer 5, and the photoresist that had been applied onto a predetermined region of the p-type GaN layer 5 was removed through photolithography, to thereby form a window.

(3) The deposition apparatus was evacuated to $10^{-3}$ Pa or less, and subsequently a Co layer (thickness: about 15 Å); i.e., a first metallic layer 61, was formed on the remaining photoresist and the exposed surface of the p-type GaN layer 5.

(4) Subsequently, an Au layer (thickness: about 60 Å); i.e., a second metallic layer 62, was formed on the first metallic layer 61.

(5) Subsequently, the resultant sample was removed from the deposition apparatus, and the Co and Au layers that had been deposited onto the photoresist were removed through a lift-off method.

(6) Subsequently, an electrode pad 7 for bonding was formed on a portion of the light-transmittable p-electrode 6. Specifically, a photoresist was uniformly applied onto the electrode 6, and a window was formed at a region of the photoresist on which the electrode pad 7 was to be formed. Subsequently, a metallic layer containing gold (Au) (thickness: about 1.5 $\mu$m) was formed through deposition, and, in a manner similar to that of (5) above, the Au-containing metallic layer formed on the photoresist was removed through a lift-off method, to thereby form the electrode pad 7.

(7) Thereafter, the electrical resistance of the p-type semiconductor layer was lowered though the method of the present invention. Specifically, the p-type semiconductor layer was irradiated with electrons through the aforementioned metallic layer (electrode) in air by use of the aforementioned electron irradiation apparatus 100. In this case, the acceleration voltage supplied from the high-voltage power supply (see FIG. 1) was regulated to 100 to 250 kV.

Through this electron irradiation, alloying of the p-type GaN layer 5 and the first and second metallic layers 61 and 62 was performed, along with alloying of the negative electrode 8 and the n-type GaN layer 3.

Through the above-described procedure, the light-emitting device 10 was produced.

In the light-emitting device 10 produced through the aforementioned procedure, the electrical resistance of the p-type GaN layer 5 can be effectively lowered within a short period of time; i.e., within about three minutes, which is considerably shorter than the time required in the case of a conventional element.

FIG. 6 shows a table describing electron irradiation conditions for the p-type semiconductors of the light-emitting devices 10, 50, and 70 produced through the method of the present invention by use of the electron irradiation apparatus 100 shown in FIGS. 1 and 2. The light-emitting device 50 was irradiated with electrons in an atmosphere including nitrogen ($N_2$) and oxygen ($O_2$) (concentration: about 50 ppm).

Figure 7:
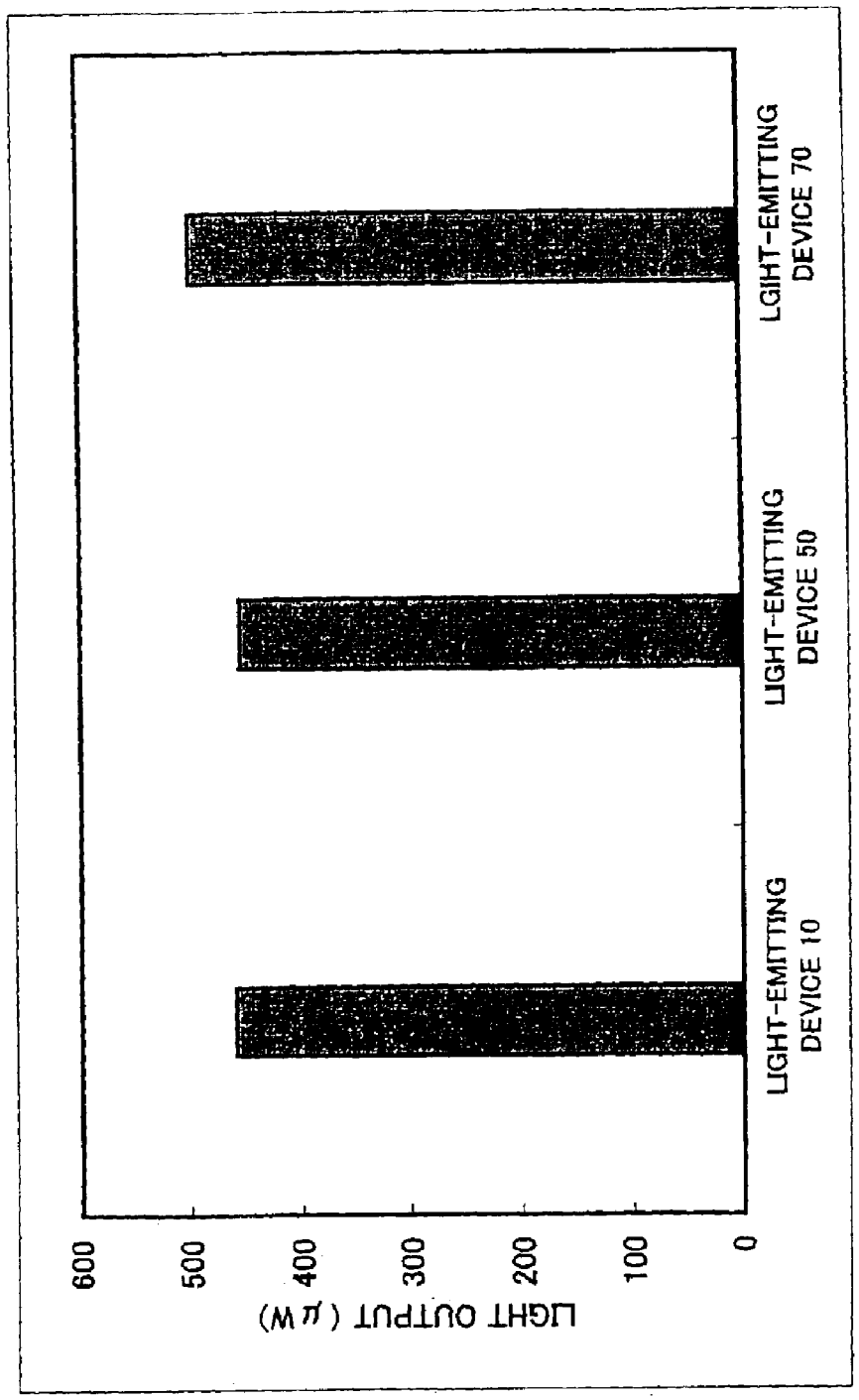
FIG. 7 is a graph showing the light outputs of the light-emitting devices 10, 50, and 70.

FIG. 7 is a graph showing the light outputs of the light-emitting devices 10, 50, and 70 under supplying an electric current. The results show that when electron irradiation is performed in air at atmospheric pressure through the method of the present invention, high light output is obtained. Conceivably, such high light output is attributed to the effects of the eleventh or twelfth feature of the present invention (claim 11 or 12).

Figure 8:
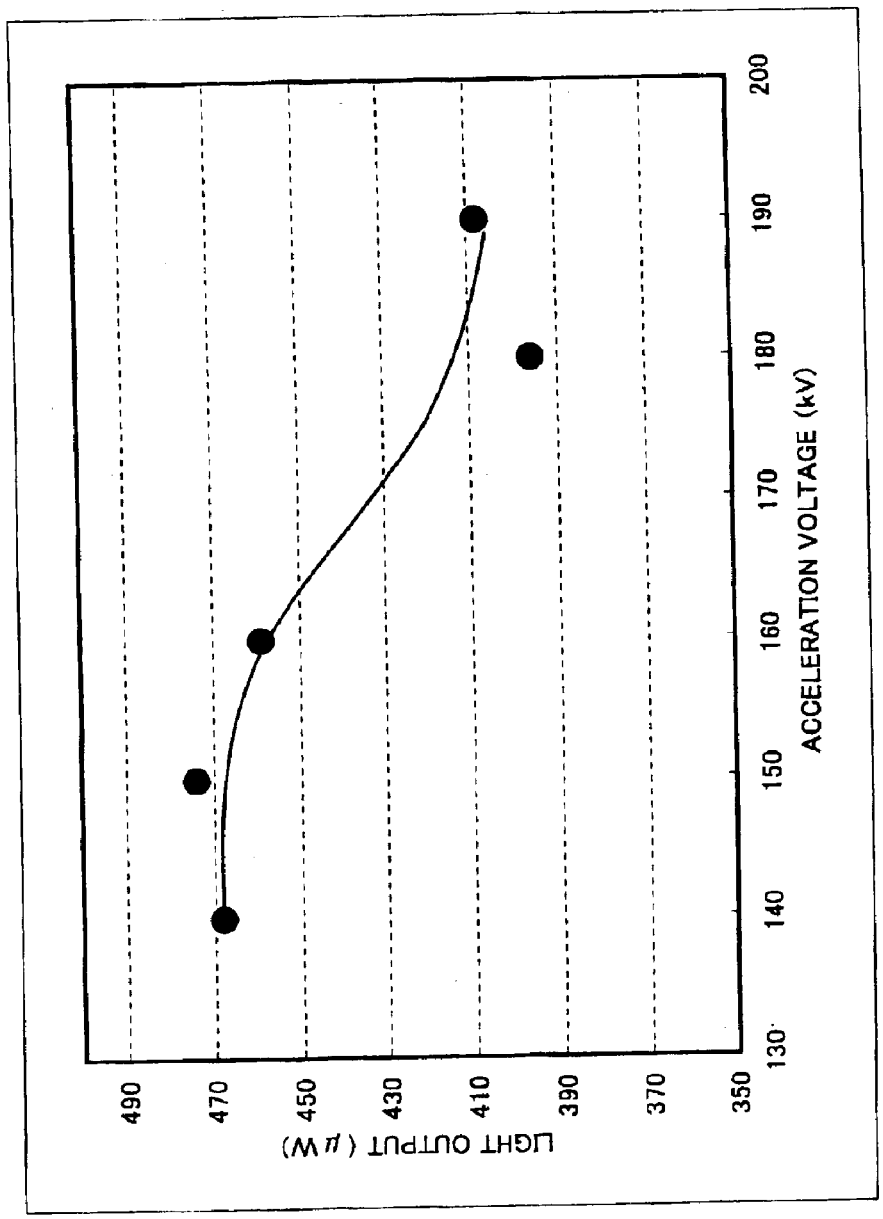
FIG. 8 is a graph showing the light output of the light-emitting device 10, when the device 10 is irradiated with electrons at different acceleration voltages.

FIG. 8 is a graph showing the light output of the light-emitting device 10, when the device 10 is irradiated with electrons at different acceleration voltages. As shown in FIG. 8, the higher the acceleration voltage, the lower the light output. Therefore, preferably, the light-emitting device is irradiated with excited-state electrons at an acceleration voltage of 160 kV or less.

Figure 9:
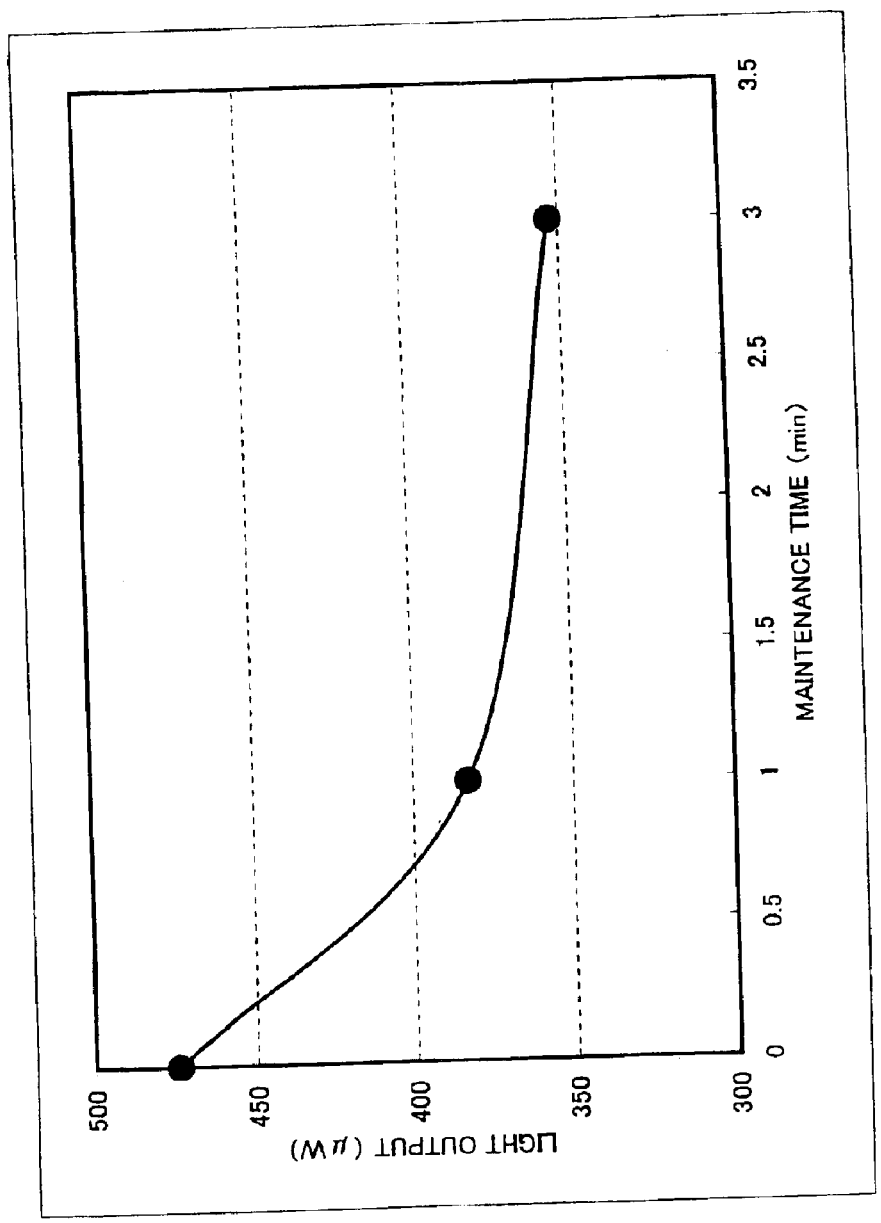
FIG. 9 is a graph showing the light output of the light-emitting device 10, when the device 10 is irradiated with electrons at an acceleration voltage of 150 kV, and the acceleration voltage is maintained for 0 to 3 minutes after the current value has reached 11 mA (optimum value).

FIG. 9 is a graph showing the light output of the light-emitting device 10, when the device 10 is irradiated with electrons at an acceleration voltage of 150 kV, and the acceleration voltage is maintained for 0 to 3 minutes after the current value has reached 11 mA (optimum value). As is clear from this graph, the longer the maintenance time, the lower the light output. Therefore, the maintenance time is preferably 0 to about 1 minute.

Although not described in the third embodiment, the following process is also effective. Specifically, after electron irradiation is performed, the entirety of the metallic layer which has been formed on the p-type semiconductor before electron irradiation is removed, and then a metallic layer (i.e., a positive electrode of a semiconductor element) is formed on the p-type semiconductor. Therefore, the metallic layer which has been formed on the surface of the p-type semiconductor before electron irradiation does not necessarily satisfy requirements for a positive electrode of a semiconductor element.

When a positive electrode of a semiconductor element is formed of an alloy, alloying conditions for the positive electrode can be determined (optimized) separately from other processes of the method of the present invention, in accordance with the type of a metal employed for forming the positive electrode and the thickness of the electrode. Therefore, the operation voltage of the semiconductor element can be reliably reduced.

When a thick metallic electrode containing one or more metals exhibiting excellent ohmic properties is formed without removing the metallic layer for irradiation, a flip-chip-type light-emitting device can be produced.

In the third embodiment, the light-emitting layer 4 of the light-emitting device 10 has an MQW structure. However, the light-emitting layer 4 may have an SQW structure; or may be formed of a layer of, for example, $Ga_xIn_{1-x}N$ (e.g., $Ga_{0.08}In_{0.92}N$), or a ternary or quaternary semiconductor represented by AlGaInN having arbitrary compositional proportions. Specific examples of the ternary and quaternary semiconductors which may be employed include ternary Group III nitride compound semiconductors (e.g., GaInN, AlInN, and AlGaN), and quaternary Group III nitride compound semiconductors (e.g., AlGaInN), which are represented by $Al_xGa_yIn_{1-x-y}N$ (wherein $0 \leq x \leq 1$, $0 \leq y \leq 1$, and $0 \leq x+y \leq 1$).

Although Mg is employed as a p-type impurity in the embodiments, a Group II element such as beryllium (Be) or zinc (Zn) may be employed.

The present invention can be applied to the case where a conventional light-transmittable metallic electrode is employed, and to the case where a thick electrode (e.g., a flip-chip-type electrode) is employed. In addition, the present invention can be applied to light-emitting devices such as LEDs and LDs, and to light-receiving-devices.

While the present invention has been described with reference to the above embodiments, the present invention is not limited thereto, but may be modified as appropriate without departing from the spirit of the invention.

The entire disclosures and contents of Japanese Patent Application Nos. 2000-253424 and 2000-254306, from which the present invention claims convention priority, are incorporated herein by reference.

What is claimed is:

1. A method for producing a p-type semiconductor having low electrical resistance comprising:
    generating wide-area-radiation excited-state electrons using an electron irradiation apparatus;
    disposing a p-type impurity-doped semiconductor a predetermined distance from an electron extraction window of said electron irradiation apparatus; and
    irradiating an electron irradiation surface of said p-type impurity-doped semiconductor with said wide-area-radiation excited-state electrons.

2. A method for producing a p-type semiconductor of low electrical resistance according to claim 1, wherein the predetermined distance is within a range of about ten millimeters to about forty millimeters.

3. A method for producing a p-type semiconductor of low electrical resistance according to claim 1, wherein said p-type impurity-doped semiconductor is disposed substantially parallel to said electron extraction window.

4. A method for producing a p-type semiconductor of low electrical resistance according to claim 1, wherein the electric potential of the electron irradiation surface is maintained generally constant through grounding.

5. A method for producing a p-type semiconductor of low electrical resistance according to claim 1, wherein the p-type impurity-doped semiconductor comprises a Group III nitride compound semiconductor.

6. A method for producing a p-type semiconductor of low electrical resistance according to claim 1, wherein the pressure of an atmosphere surrounding the p-type impurity-doped semiconductor is approximately atmospheric pressure.

7. A method for producing a p-type semiconductor of low electrical resistance according to claim 1, wherein the atmosphere surrounding the p-type impurity-doped semiconductor comprises air or a gas having an oxygen content lower than that of air.

8. A method for producing a p-type semiconductor of low electrical resistance according to claim 1, wherein the p-type impurity-doped semiconductor is installed outside of said electron irradiation device.

9. A method for producing a p-type semiconductor of low electrical resistance by lowering the electrical resistance of a p-type impurity-doped semiconductor, comprising:
    using an electron irradiation apparatus for generating wide-area-radiation excited-state electrons,
    setting said p-type impurity-doped semiconductor on a holder installed outside of said electron irradiation apparatus;
    irradiating said wide-area-radiation excited-state electrons, like a surface at once without scanning, onto an electron irradiation surface of said p-type impurity-doped semiconductor; and
    lowering the electrical resistance of said p-type impurity-doped semiconductor by said irradiating.

10. A method for producing a p-type semiconductor of low electrical resistance according to claim 9, wherein the semiconductor comprises a Group III nitride compound semiconductor.

11. A method for producing a p-type semiconductor of low electrical resistance according to claim 9, wherein the impurity comprises magnesium (Mg).

12. A method for producing a p-type semiconductor of low electrical resistance according to claim 9, wherein the pressure of an atmosphere surrounding the semiconductor is approximately atmospheric pressure.

13. A method for producing a p-type semiconductor of low electrical resistance according to claim 9, wherein the atmosphere surrounding the semiconductor comprises air or a gas having an oxygen content lower than that of air.

14. A method for producing a p-type semiconductor of low electrical resistance according to claim 9, wherein the electron irradiation surface of the semiconductor is irradiated with the electrons through a metallic layer formed on the surface.

15. A method for producing a p-type semiconductor of low electrical resistance according to claim 14, wherein the thickness of the metallic layer is 5 to 3,000 Å.

16. A method for producing a p-type semiconductor of low electrical resistance according to claim 14, wherein the metallic layer is formed of cobalt (Co), nickel (Ni), aluminum (Al), copper (Cu), palladium (Pd), manganese (Mn), vanadium (V), gold (Au), or an alloy containing at least one of these metals.

17. A method for producing a p-type semiconductor of low electrical resistance according to claim 14, wherein the atmosphere surrounding the semiconductor or the metallic layer comprises an oxygen (O)-containing gas.

18. A method for producing a p-type semiconductor of low electrical resistance according to claim 9, wherein a voltage for accelerating electrons which are radiated onto the electron irradiation surface is regulated to 160 KV or less.

19. A method for producing a p-type semiconductor of low electrical resistance according to claim 9, wherein the acceleration voltage and the electric current are maintained for at most one minute from a point in time at which the electric current of the electrons radiated onto the electron irradiation surface has reached an optimum value.

20. A method for producing a p-type semiconductor of low electrical resistance according to claim 9, wherein the electric potential of the electron irradiation surface is maintained generally constant through grounding.

* * * * *